United States Patent [19]

Schnegg et al.

[11] Patent Number: 5,051,134

[45] Date of Patent: Sep. 24, 1991

[54] PROCESS FOR THE WET-CHEMICAL TREATMENT OF SEMICONDUCTOR SURFACES

[75] Inventors: Anton Schnegg, Burghausen; Laszlo Fabby, Emmerting; Peter Nusstein, Munich; Gertrud Valouch, Burghausen, all of Fed. Rep. of Germany

[73] Assignee: Wacker-Chemitronic Gesellschaft fur Elektronik-Grundstoffe m.b.H., Burghausen, Fed. Rep. of Germany

[21] Appl. No.: 626,490

[22] Filed: Dec. 12, 1990

[30] Foreign Application Priority Data

Jan. 26, 1990 [DE] Fed. Rep. of Germany ....... 4002327

[51] Int. Cl.$^5$ ............................................... C23G 1/02
[52] U.S. Cl. .......................................... 134/3; 134/41; 252/142; 252/143; 156/640; 156/662
[58] Field of Search ...................... 134/3, 41; 252/142, 252/143; 156/640, 662

[56] References Cited

U.S. PATENT DOCUMENTS 4,885,056  12/1989  Hall et al. ........................... 156/662

FOREIGN PATENT DOCUMENTS 4540458  12/1970  Japan ...................................... 134/3
0126869  11/1978  Japan .................................... 156/662

Primary Examiner—Theodore Morris
Assistant Examiner—Zeinab El-Arini
Attorney, Agent, or Firm—Collard, Roe & Galgano

[57] ABSTRACT

In the treatment of semiconductor slices, in particular silicon slices, with aqueous solutions containing hydrofluoric acid, a contamination of the slice surface with particles which interfere with the subsequent processes has been observed. This increase in particles can be markedly decreased by additionally adding to the solutions, organic ring molecules capable of forming inclusion compounds, such as, for instance, cyclodextrins, and/or acids with pKa below 3.14 which are incapable of oxidizing the semiconductor material. The actual treatment can be carried out in the usual way, for example, in immersion baths.

10 Claims, No Drawings

PROCESS FOR THE WET-CHEMICAL TREATMENT OF SEMICONDUCTOR SURFACES

BACKGROUND OF THE INVENTION

1. Field of the Invention

The invention relates to a process for the wet-chemical treatment of semiconductor surfaces by exposure to aqueous solutions containing hydrofluoric acid, and also relates to solutions for carrying out this treatment.

2. The Prior Art

Many processes in semiconductor technology in which a semiconductor slice surface is first subjected to a wet-chemical treatment include a subsidiary step in which an already present or formed surface oxide layer is completely or partially removed again from the slice surface. In silicon technology, those subsidiary steps are of particular importance in which, for example, in cleaning or photolithographic processes, just as in heat-treatment or gettering processes, the production and subsequent removal of surface oxide layers are standard operations and often occur several times in succession. By way of example, reference may be made to the cleaning process described by W. Kern and D. Puotinen in RCA Review, June 1970, pp. 187–206 (often described as "RCA-cleaning" in technical jargon). A sequence of wet-chemical oxidation and removal steps is described therein which serves to convert the surfaces of silicon slices, after chemo-mechanical polishing, to a state which is suitable for component manufacture and in which they, therefore, not only have an excellent geometrical quality, but also have a high degree of chemical purity and are free of particles.

In virtually all cases, the partial or complete stripping of the oxide layers present in each case is carried out with the aid of hydrofluoric acid, the latter, in general, either reacting with the oxide in aqueous solution in an immersion bath or, alternatively, via the vapor phase. At the same time, experience shows that the hydrofluoric acid solutions used in aqueous form additionally have a markedly better cleaning action compared with those in vapor form in relation to the heavy metals, in particular iron, which contaminate the slice surface.

Treatment with hydrofluoric acid in aqueous form has, however, a serious disadvantage. Specifically, during the treatment, the number of particles on the slice surface, as a rule, increases markedly, with the result that a further treatment step usually has to be carried out in order to reduce the number of particles to a level suitable for the further processing of the slices. In general, the particles are composed of polysilicic acid and organic substances contained in the solution. For example, in the case of silicon slices having a diameter of approximately 10 cm, their increase is quite likely to amount to 5,000 particles, based on particles in the size range from 0.17 to 1 $\mu$m, which can be determined particularly well metrologically. The number of particles can be determined, for example, with the aid of scattered light measuring methods. In these, the slice surface is irradiated, for example, with laser light and the intensity of the scattered light emitted from it measured, which intensity can be correlated with the number of particles.

The number of particles is particularly high if the slice is lifted out of a bath containing hydrofluoric acid solution or if the wet slice surface freshly treated with hydrofluoric acid is exposed to the action of oxygen, as is, for example, also the case in hydrofluoric acid baths having vigorous circulation. Disadvantageously, the number of particles increases still further during subsequent oxidative cleaning steps in an alkaline or an acidic aqueous medium.

Hitherto, attempts have been made to counteract this problem by diluting the hydrofluoric acid solution, i.e., by supplying a fairly large amount of ultra-pure water consequently reducing the number of particles present in the unit volume of the aqueous phase containing hydrofluoric acid. The amounts of ultra-pure water used in this method are, however, appreciable. If, on the other hand, the hydrofluoric acid solution is used in very dilute form as in another known procedure, the necessary exposure time is consequently prolonged to such an extent that a rapid and economically acceptable processing is no longer guaranteed. This applies even to process variants in which the solution is circulated in bubble-free form and is subjected to a filtration at the same time.

The surfaces produced in all such processes always still contain, however, nuclei for further particle growth, with the result that, as a rule, a marked increase in the numbers of particles can be detected again on the slice surface, which previously appeared satisfactorily, in subsequent alkaline and acidic oxidative treatment steps.

SUMMARY OF THE INVENTION

An object of the invention is, therefore, to provide a simple process which makes possible the treatment of semiconductor, in particular silicon, slices with aqueous solutions containing hydrofluoric acid without an associated substantial increase in the number of particles present on the slice surface.

The above object is accomplished, in accordance with the present invention, by providing a process for the wet-chemical treatment of a semiconductor surface comprising contacting the semiconductor surface with an aqueous solution containing hydrofluoric acid, the solution containing at least one additional constituent selected from the group consisting of (a) an organic compound capable of forming inclusion compounds and forming ring molecules; (b) an acid which does not oxidize the semiconductor surface to be treated and has a pKa of less than 3.14, individually or in combination, as a mixture of acids; and (c) a mixture of (a) and (b).

The present invention is also directed to an aqueous solution for the wet-chemical treatment of a semiconductor surface comprising from about 0.08% to 6% by weight of hydrofluoric acid, the solution containing at least one additional constituent selected from the group consisting of (a) from about 0.01% to 10% by weight of an organic compound capable of forming inclusion compounds and forming ring molecules; (b) from about 0.1% to 5% by weight of an acid which does not oxidize the semiconductor material to be treated and has a pKa of less than 3.14, individually or in combination, as a mixture of acids; and (c) a mixture of (a) and (b), with each weight being based upon the total weight of the solution.

Surprisingly, it was found that the numbers of particles which can be detected subsequently to the hydrofluoric acid treatment on the semiconductor surface can be markedly reduced by this method. Particularly noteworthy is the fact that no increase, but a further decrease, is to be observed in the numbers of particles, even in subsequent alkaline or acidic oxidative treatment steps.

DETAILED DESCRIPTION OF THE PREFERRED EMBODIMENTS

As organic compounds capable of forming inclusion compounds and forming ring molecules, use is made, with particular advantage, of cyclodextrins, that is to say of compounds composed of glucose rings linked to one another such as are formed, for example, in the biological degradation of starch by *Bacillus macerans*. In this connection, the α-cyclodextrins composed of 6 glucose rings, the β-cyclodextrins composed of 7 glucose rings and also the γ-cyclodextrins composed of 8 glucose rings have all proved suitable. The hydroxypropyl derivatives of these cyclodextrins, in particular hydroxypropyl-α-cyclodextrin, have proved especially successful, although it is possible that the corresponding methyl-, ethyl-, isopropyl-, butyl- or isobutylhydroxy derivatives can also be used. At the same time, it is possible to use either mixtures of different cyclodextrins, or only particular cyclodextrin derivatives individually, on their own, as additional constituent (a) in a particular case. Advantageously, cyclodextrins are used whose molar degree of substitution (MS) is in the range from 0.5 to 3, preferably 0.5 to 1. From this MS value, it is possible to estimate the proportion to which the available OH groups are substituted in the particular cyclodextrin, which, as a rule, exists as a mixture of compounds substituted to different extents.

In addition to the preferably used cyclodextrins, other organic compounds forming ring molecules, such as, for instance, crown ethers, are also suitable for use as constituent (a). Examples of suitable crown ethers are those which have an adequate ring size, such as, for instance, the basic ring structures described as 15-crown-5, 18-crown-6 or 24-crown-8, from which derivatives have been formed, preferably with hydrophilizing substituents such as, for instance, OH, $OCH_3$ or COOH groups.

Advantageously, in preparing the mixture which finally acts on the semiconductor surfaces, the cyclodextrins provided as constituent (a) are mixed in aqueous solution, with the starting solution containing hydrofluoric acid. Having an amount of cyclodextrin or constituent (a) of about 0.01% to 10% by weight, based upon the total solution weight, has proved desirable for the final aqueous additive solution. Alternatively, however, the cyclodextrins may also be added in undissolved form or in more highly concentrated solutions. The crown ethers may also advantageously be added in dissolved form.

The solutions containing hydrofluoric acid which are common in semiconductor technology are suitable as basic solutions, both as regards the concentrations, and also the necessary freedom from chemical contaminants, and also from particles. The hydrofluoric acid content is adjusted, in each case, in accordance with the intended application and is, in most cases, below about 40% by weight, but preferably below about 10% by weight. In the ready-mixed solution which acts on the semiconductor surface, especially good results have been achieved with hydrofluoric acid in the range from about 0.08% to 6% by weight, based upon the total solution weight. Advantageously, the desired concentrations can be established by diluting concentrated hydrofluoric acid solutions which can, for example, be obtained commercially with specifications conforming to the requirements in relation to purity and number of particles. However, process variants are also possible in which the hydrogen fluoride still needed is introduced in gaseous form into an aqueous solution, free of hydrofluoric acid or low in hydrofluoric acid, which has been made up and already contains the other components. Such a procedure has proved successful, in particular, in processes in which the semiconductor surfaces are sprayed with the solution and the composition which finally acts is only formed directly on the surfaces by liquid and gas phase acting together. In this connection, reference may be made, for example, to the process described in DE-A 3,818,714, or the corresponding U.S. patent application Ser. No. 359,508, filed June 1, 1989.

A further possibility for reducing the number of particles in treating semiconductor surfaces with aqueous solutions containing hydrofluoric acid is to add to the latter, alternatively or additionally to the constituents (a) described above, acids as constituent (b) which do not oxidize the semiconductor material to be treated and have a pKa of less than 3.14, in which connection, inorganic and/or organic acids may be used. Surprisingly, it was found, in particular, that if the constituent (b) is added, either individually on its own or, in particular, in combination with the constituent (a) markedly lower numbers of particles can be detected on the semiconductor surfaces treated with aqueous hydrofluoric acid solutions with such compositions than if the treatment is carried out with aqueous hydrofluoric acid solutions not containing such additives.

Suitable inorganic acids are, in particular, the hydrohalic acids HBr, HI or, in particular, HCl, since no oxidative attack on the semiconductor material is possible in their case. Furthermore, oxygen-containing acids with suitably low pKa's which are not capable of oxidizing the semiconductor material to be treated, such as, for example, sulfuric or perchloric acid, in the case of silicon or germanium, whose pKa is approximately -3 or -9, respectively, are also suitable. Experience shows that better results are achieved with acids having negative pKa, that is having a greater acid strength, than with, on the other hand, weaker acids such as, for instance, phosphoric acid, whose pKa is 1.96 in the first dissociation stage.

Suitable organic acids are, for example, strongly acidic carboxylic acids having appropriately low pKa's such as, for instance, mono-, di- or trichloroacetic acid or trifluoroacetic acid. These acids additionally have the advantage of bactericidal action. Other suitable acids are, for example, some sulfonic acids, i.e., organic derivatives of sulfuric acid.

Advantageous concentrations of the acid constituent (b) are in the range up to approximately 2% by weight, based on the entire solution weight, it being possible to achieve particularly good results with proportions of 0.5 to 1% by weight. In principle, however, an even broader range of proportions of the acid selected as constituent (b) of 0.1% up to about 5% by weight, based upon the total weight of the solution, is possible, as is the use of mixtures of acids.

The desired concentrations can be established, in a simple way, by diluting more highly concentrated starting compounds, for which purpose, for example, the hydrofluoric acid which can be obtained commercially in a quality conforming to the exceptionally high purity requirements of the semiconductor industry and normally having a concentration of not more than 50% by weight or hydrochloric acid, with a concentration of approximately 37% by weight are suitable. Of course, water of equivalent purity and particle freedom is required for dilution. Furthermore, the possibility is not excluded of bringing the required acid to the desired composition by supplying gaseous components such as, for instance, gaseous hydrogen chloride, or by adding acid anhydrides such as, for instance, phosphoruspentoxide, to the aqueous phase.

In particular, aqueous solutions containing hydrofluoric acid which contain 0.08 to 6% by weight of hydrogen fluoride and at least one of the constituents (a) and (b), and to be specific, up to 2% by weight of hydrogen chloride as constituent (b) and up to 0.1% by weight of cyclodextrin as constituent (a) have proved successful for treating silicon slices provided with oxide layers. Particularly good results in relation to the particle freedom of treated slices, both after exposure to hydrofluoric acid and also after subsequent alkaline or acidic oxidative process steps can be achieved with solutions which contain 0.8 to 1.2% by weight of hydrogen fluoride, 0.7 to 1.1% by weight of hydrogen chloride and 0.01 to 0.03% by weight of hydroxyalkyl-$\alpha$-cyclodextrin, in particular, hydroxypropyl-$\alpha$-cyclodextrin. Advantageously, the molar degree of substitution of the cyclodextrins is 0.5 to 1.

The aqueous solution containing hydrofluoric acid selected in each case can be caused to act on the semiconductor surfaces to be treated with the aid of the known methods. It can be done, for example, in immersion baths which have possibly been set to particular temperatures and in which the semiconductors, preferably in the form of slices, are immersed individually, or in combination, in processing trays, left there for the exposure time desired in a particular case and are then removed again. Advantageously, the bath liquid is circulated during this process and/or the slices are subjected to a slow movement in the bath in order to achieve a particularly effective exposure. Another method of exposure is to spray or spin the solution onto the slice surface, which is expediently done in suitably equipped treatment chambers such as spray or spin etchers.

This may be followed in the usual manner by subsequent treatment steps such as hydrophilization, wet-chemical or thermal oxidation, drying, irradiation or deposition operations. As already explained above, the numbers of particles are reduced in the case of such pre-treated slices in the subsequent alkaline or acidic oxidative processes, whereas an appreciable increase usually occurs in slices which have been conventionally subjected to a acidic oxidative pretreatment.

A further improvement in the results can be achieved if, subsequent to the treatment with aqueous hydrochloric acid solution additionally containing the constituents (a) and/or (b), the slices are briefly treated with ultraviolet light, expediently after a rinsing and drying step. In this connection, irradiation times of 0.5 to 10 minutes have proved beneficial. The irradiation can be carried out by means of suitable area-covering radiation sources, for example, by means of low-pressure mercury lamps, with which the irradiated area is large enough to ensure a uniform irradiation of the slice surface. Suitable wavelengths are, for example, in the range from 180 to 500 nm for silicon. Such after-treated slices are, in general, distinguished by particularly low numbers of particles.

The process and aqueous solution according to the invention are generally suitable for the treatment of slices composed of such semiconductor materials which develop oxide layers which are attacked by hydrofluoric acid. With particular advantage, it is used for the treatment of silicon slices, and to be specific, in particular in the cleaning of haze-free polished slices before packaging, the cleaning of slices before the so-called LTCVD (low-temperature-gas-phase deposition, for example, of polycrystalline or oxidic material) deposition; and in etching away thermally oxidized silicon surfaces. Other application possibilities are the treatment of other elemental semiconductors such as germanium, or of compound semiconductors such as gallium arsenide, indium phosphide or gallium phosphide.

The present invention will now be further disclosed by reference to the following examples, which are supplied solely for the purpose of illustration and are not intended as defining the limits and scope of the present invention.

Example 1

Groups of five silicon slices polished so as to be haze-free (slice diameter approximately 20 cm, (111) orientation, resistivity approximately 5–50 $\Omega$cm) were, in each case, provided as the substrates to be treated, which slices had been subjected to a hydrophilic cleaning by immersion in an ammonia/$H_2O_2$ bath, with the result that their surface was coated with a thin oxide skin. The slices were inserted in polytetrafluoroethylene (PTFE) processing trays and immersed for 2 minutes in an immersion bath, a polytetrafluoroethylene tank containing about 6 liters of liquid. The latter was charged, in each case, with an aqueous solution containing hydrofluoric acid to which constituents (a) and/or (b) had been added in the manner specified below. During the immersion time, the trays were moved slowly to and from in the bath liquid, so that a good supply or removal of unused or used solution was ensured. The bath temperature was held at approximately 25° C.

The solutions used in the various treatments were prepared by diluting concentrated starting mixtures of suitable composition by means of ultra-pure water to 6 liters, in each case. The starting mixtures were prepared by mixing suitable proportions of 50% strength by weight aqueous hydrofluoric acid, 2% strength by weight aqueous hydroxypropyl-$\alpha$-cyclodextrin solution (MS 0.6) and 34% strength by weight aqueous hydrochloric acid.

After the intended treatment time has elapsed, the solution was rapidly drained out of the immersion bath and the slices were spin-dried. Some of the slices were then also subjected to irradiation for two minutes under a UV lamp (wave length 254 nm, low-pressure mercury design, spiral radiator arrangement, spiral diameter equal to slice diameter).

Some of the non-irradiated and some of the irradiated slices were, furthermore, also subjected to a 10-minute alkaline oxidizing immersion treatment in aqueous ammonia/hydrogen peroxide solution at approximately 60° C., rinsed and then spin-dried.

For comparison purposes, further groups of slices were subjected to analogous treatment steps, in which, however, the treatment with aqueous solution containing hydrofluoric acid was carried out without adding the constituents (a) and/or (b).

Before the start and conclusion of the intended treatment sequence, every slice was examined in a commercial particle measurement apparatus to determine the number of particles present on the polished surface.

During the measurement, a laser beam was directed onto the slice surface and the intensity of the diffused scattered light emitted by it was measured. From this, the number of particles present on the surface can be determined, since the latter act as scattering centers for the irradiated light, and consequently, the scattered light intensity increases with an increasing number of particles. Another possible method of measurement is to count the particles visible as points of light in the microscope.

The results obtained are summarized in the table below. They show that silicon slices treated by the process and solution according to the invention are distinguished by markedly reduced particle values compared to silicon slices treated in the conventional way, without additives. This applies both to the silicon slices examined immediately after the treatment with hydrofluoric acid and also to those examined after the UV irradiation, as well as to those examined after the alkaline oxidizing treatment in which, in a remarkable way, a further decrease in the numbers of particles ca be detected.

hydrofluoric acid. In the first experimental run, a 1%-strength by weight aqueous HF solution was used as bath liquid; in the subsequent run, a proportion of 0.9% by weight of HCl was added as constituent (b), while a proportion of 0.02% by weight of hydroxypropyl-α-cyclodextrin was, furthermore, additionally present in the solution in the third run as constituent (a). In all three experimental runs, the solution had an iron contamination amounting to 0.1 ppm by weight, based on the total solution weight.

The combination of the treated slices due to this iron content of the bath liquid was determined by measuring the diffusion length of minority charge carriers. The measurement was carried out in accordance with the test method described in the conference report for the spring meeting of the Electrochemical Society held May 15th to 20, 1988, in Atlanta, Georgia, on page 273 as Abstract 177, of G. Zoth and W. Bergholz entitled "Fast Large Area Determination of Fe Concentration in P-type Silicon." In this connection, the resulting diffusion lengths are the shorter, the more strongly the slices are contaminated with iron.

| HF solution, composition | | | UV irradiation (+ = carried out − = not carried out) | $NH_3/H_2O_2$ bath | number of particles on the surface (0.17 – 1 μm particle size) |
| --- | --- | --- | --- | --- | --- |
| HF (% by weight) | HCl (% by weight) | Cyclodextrins (% by weight) | | | |
| 1.0 | 0   | 0    | − | − | 4098 |
| 1.0 | 0.9 | 0    | − | − | 1755 |
| 1.0 | 0   | 0.02 | − | − | 328  |
| 1.0 | 0.9 | 0.02 | − | − | 228  |
| 1.0 | 0   | 0    | + | − | 1086 |
| 1.0 | 0.9 | 0    | + | − | 302  |
| 1.0 | 0   | 0.02 | + | − | 288  |
| 1.0 | 0.9 | 0.02 | + | − | 50   |
| 1.0 | 0   | 0    | − | + | 915  |
| 1.0 | 0.9 | 0    | − | + | 236  |
| 1.0 | 0   | 0.02 | − | + | 212  |
| 1.0 | 0.9 | 0.02 | − | + | 249  |
| 1.0 | 0   | 0    | + | + | 870  |
| 1.0 | 0.9 | 0    | + | + | 217  |
| 1.0 | 0   | 0.02 | + | + | 68   |
| 1.0 | 0.9 | 0.02 | + | + | 36   |

Example 2

Utilizing a procedure analogous to that described in Example 1, groups of 5 silicon slices polished so as to be haze-free and of the same specification were subjected to a treatment with an aqueous solution containing hydrofluoric acid, with the difference that a proportion of 0.02% by weight, based on the total solution weight, of a crown ether had been added to the solution as constituent (a). Since there was adequate solubility in the aqueous phase, it was possible for the crown ethers to be used in unsubstituted form. The HF content of the solution was, in all cases, approximately 1% by weight, based on the total solution weight.

In the case of the slices treated with additive-free HF solution, the number of particles determined after the treatment was approximately 5,000. After adding 0.02% by weight of 15-crown-5, the number of particles decreased to 2,498, while it was possible to reduce it to 1,103 with the aid of a solution containing 24-crown-8.

Example 3

Five silicon slices polished so as to be haze-free and having the specifications mentioned in Example 1 were again treated in the manner described therein in a immersion bath filled with aqueous solution containing In the slices treated in the first experimental run, the diffusion length was 23 μm, which indicated a marked contamination with the iron present in the solution. In the treatment of the slices with the solution additionally containing the constituent (b) in the second experimental series, the contamination was reduced and the diffusion length rose to approximately 49 μm. In the case of the slices treated in the third experimental series with the solution containing the constituents (a) and (b), yet another appreciable decrease in the contamination resulted, which was revealed by the excellent value of 216 μm for the diffusion length of the minority charge carriers.

While only a single embodiment of the present invention has been shown and described, it is to be understood that many changes and modifications may be made thereunto, without departing from the spirit and scope of the invention as defined in the appended claims.

What is claimed is:

1. A process for the wet-chemical treatment of a semiconductor surface comprising:
    contacting said semiconductor surface with an aqueous solution containing hydrofluoric acid, said solution containing at least one additional constituent selected from the group consisting of:
- (a) an organic compound capable of forming inclusion compounds and forming ring molecules comprising a cyclodextrin or crown ether
- (b) an acid which does not oxidize the semiconductor surface to be treated and has a pKa of less than 3.14, individually or in combination, as a mixture of acids; and
- (c) a mixture of (a) and (b).

2. The process as claimed in claim 1, wherein said cyclodextrin has 6 to 8 D-glucose units.

3. The process as claimed in claim 1, wherein the amount of constituent (a) is up to 0.1% by weight, based on the total solution weight.

4. The process as claimed in claim 1, wherein constituent (b) comprises a hydrohalic acid.

5. The process as claimed in claim 1, wherein the proportion of the constituent (b) is up to 2% by weight, based on the total solution weight.

6. The process as claimed in claim 1, wherein, subsequent to contacting said surface with said aqueous solution containing hydrofluoric acid, said semiconductor surface is irradiated with UV light.

7. The process as claimed in claim 1, wherein the aqueous solution comprises from 0.08% to 6% by weight of hydrofluoric acid and up to 0.1% by weight of cyclodextrin as constituent (a).

8. The process as claimed in claim 1, wherein the aqueous solution additionally contains up to 2% by weight of hydrogen chloride as constituent (b).

9. The process as claimed in claim 1, wherein the aqueous solution contains:
from about 0.08% to 6% by weight of hydrofluoric acid; wit
- (a) from about 0.01% to 10% by weight of said organic compound; and
- (b) from about 0.1% to 5% by weight of said acid;

with each weight being based upon the total weight of th solution.

10. The process as claimed in claim 1, wherein the aqueous solution contains:
from about 0.8% to 1.2% by weight of hydrofluoric acid; with
- (a) from about 0.01% to 0.03% by weight of said organic compound; and
- (b) from about 0.7% to 1.1% by weight of said acid;

with each weight being based upon the total weight of the solution.

* * * * *